United States Patent [19]

Nakao

[11] Patent Number: 5,332,936
[45] Date of Patent: Jul. 26, 1994

[54] COMPOSITE LOGIC CIRCUIT

[75] Inventor: Tomoaki Nakao, Yamatokoriyama, Japan

[73] Assignee: Sharp Kabushiki Kaisha, Osaka, Japan

[21] Appl. No.: 45,708

[22] Filed: Apr. 14, 1993

[30] Foreign Application Priority Data

Apr. 14, 1992 [JP] Japan ................. 4-093987

[51] Int. Cl.⁵ .......................................... H03K 19/094
[52] U.S. Cl. ..................................... 307/475; 307/451
[58] Field of Search ............... 307/443, 448, 451, 475, 307/264

[56] References Cited

U.S. PATENT DOCUMENTS

| | | | |
|---|---|---|---|
| 4,486,670 | 12/1984 | Chan et al. | 307/264 |
| 4,703,199 | 10/1987 | Ely | 307/475 X |
| 4,920,284 | 4/1990 | Denda | 307/475 |
| 4,978,870 | 12/1990 | Chen et al. | 307/475 |
| 5,013,937 | 5/1991 | Aoki | 307/448 |
| 5,136,190 | 8/1992 | Chern et al. | 307/475 |

FOREIGN PATENT DOCUMENTS 0231062  8/1987  European Pat. Off. ............ 307/475
3196092  8/1991  Japan .

*Primary Examiner*—David R. Hudspeth

[57] ABSTRACT

When a transistor 1 is turned off, and transistors 5 and 7 are both turned on, first and second output signals Oa and Ob both attain a first potential GND irrespective of the logic level of a second logic signal Ib and a third logic signal /Ib. When the transistor 1 is turned on and the transistors 5 and 7 are both turned off by the first logic signal Ia, a transistor 4 is turned off and a transistor 6 is turned on, whereby first and second output signals Oa and Ob attain a second potential VEE and the first potential GND, respectively. When the transistor 1 is turned on, and transistors 5 and 7 are turned off, the transistor 4 is turned on and the transistor 6 is turned off, whereby the first and second output signals Oa and Ob attain the first potential GND and the second potential VEE, respectively. Thus a composite logic circuit can be implemented with 7 transistors.

4 Claims, 6 Drawing Sheets

| I a | I b | /I b | O a | O b |
|-----|-----|------|-----|-----|
| GND | GND | VDD | VEE | GND |
| GND | VDD | GND | GND | VEE |
| VEE | GND | VDD | GND | GND |
| VEE | VDD | GND | GND | GND |

| Ia | Ib | /Ib | Oa | Ob |
|-----|-----|-----|-----|-----|
| GND | GND | VDD | VEE | VEE |
| GND | VDD | GND | VEE | VEE |
| VEE | GND | VDD | VEE | GND |
| VEE | VDD | GND | GND | VEE |

COMPOSITE LOGIC CIRCUIT

BACKGROUND OF THE INVENTION

1. Field of the Invention

The present invention relates to logic circuits, and more particularly, to a composite logic circuit that carries out logical operation for a logic signal having the logic level changing between a first potential and a second potential and a logic signal having the logic level changing between the first potential and a third potential.

2. Description of the Background Art

A composite logic circuit is conventionally used for carrying out a predetermined logical operation for applied logic signals having the logic level changing between a first potential and second potential and between the first potential and a third potential. In such a composite logic circuit, a logic signal having the logic level changing between a first potential and a third potential is converted into a logic signal having the logic signal changing between the first potential and a second potential by a level shifter, followed by a logical operation for two logic signals having the logic level changing between the first potential and the second potential.

FIG. 3 is a circuit diagram of a conventional composite logic circuit to which are provided a logic signal having the logic level changing between the first potential and a second potential and a logic signal having the logic level changing between the first potential and a third potential. This composite logic circuit includes a level shifter 21 and NOR gates 26 and 27.

A first logic signal Ia having the logic level changing between a first potential GND and a second potential VEE under the relationship of VEE>GND is supplied to a first input node 41. A second logic signal Ib having the logic level changing between the first potential GND and a third potential VDD under the relationship of VDD>GND is supplied to a second input node 42. A third logic signal /Ib which is an inverted signal of the second logic signal Ib is supplied to a third input node 43.

A first output node 51 provides a first output signal Oa representing the NOR result of first and second logic signals Ia and Ib. A second output node 52 provides a second output signal Ob representing the NOR result of first and third logic signals Ia and /Ib.

Level shifter 21 converts second and third logic signals Ib and /Ib having their logic levels changing between the first potential GND and the third potential VDD into a logic signal c and a logic signal /c which is an inverted signal thereof having the logic levels changing between the first potential GND and the second potential VEE.

Level shifter 21 includes transistors 22 and 23 which are P channel MOS-FETs, and transistors 24 and 25 which are N channel MOS-FETs. These transistors 22, 23, 24 and 25 are connected between a first power supply node 61 receiving the first potential GND and a second power supply node 62 receiving the second potential VEE.

Transistor 22 has its source connected to the second power supply node 62 and its drain connected to the drain of transistor 24. Transistor 23 has its source connected to the second power supply node 62 and its drain connected to the drain of transistor 25. Transistors 24 and 25 respectively have their sources connected to the first power supply node 61. Transistor 22 has its gate connected to the node between transistors 23 and 25. Transistor 23 has its gate connected to the node between transistors 22 and 24. Transistor 24 has its gate connected to the second input node 42. Transistor 25 has its gate connected to the third input node 43.

In such a level shifter 21, transistor 22 has its gate connected to one input terminal of NOR gate 26, and transistor 23 has its gate connected to one input terminal of NOR gate 27. This connection allows logic signal c to be provided from the gate of transistor 22 to NOR gate 26, and logic signal /c provided from the gate of transistor 23 to NOR gate 27.

The first input node 41 is connected to the other input terminal of NOR gate 26 and to the other input terminal of NOR gate 27. The first output node 51 is connected to the output terminal of NOR gate 26, and the second output node 52 is connected to the output terminal of NOR gate 27.

The operation of level shifter 21 will be described hereinafter. When the second logic signal Ib attains the level of the third potential VDD, transistor 24 is turned on, whereby the gate of transistor 23 attains the potential of the first potential GND. This causes transistor 23 to be turned on, whereby the gate of transistor 22 attains the potential of the second potential VEE. Here, transistor 25 is turned off due to the third logic signal /Ib attaining the level of the first potential GND, and transistor 22 is turned off due to the gate attaining the second potential VEE.

When third logic signal /Ib attains the level of the third potential VDD, transistor 25 is turned on, whereby the gate of transistor 22 attains the first potential GND. This turns on transistor 22, whereby the gate of transistor 23 attains the second potential VEE. Here, transistor 24 is turned off due to the second logic signal Ib attaining the level of the first potential GND, and transistor 23 is turned off due to its gate attaining the second potential VEE.

When the second logic signal Ib attains the level of the third potential VDD, and the third logic signal /Ib attains the level of the first potential GND, the respective gates in transistors 22 and 23 attain the level of the second potential VEE and the first potential GND, respectively, whereby logic signals c and /c attain the level of the second potential VEE and the first potential GND, respectively. When the second logic signal Ib attains the level of the first potential GND and the third logic signal /Ib attains the level of the third potential VDD, the respective gates of transistors 22 and 23 attain the first and second potentials GND and VEE, respectively, whereby logic signals c and /c attain the level of the first and second potentials GND and VEE, respectively.

Thus, level shifter 21 converts the level of the second and third logic signals Ib and /Ib into logic signals c and /c that change within a potential range identical to that of the first logic signal Ia.

NOR gates 26 and 27 will be described in details hereinafter.

NOR gates 26 and 27 have the same structure, and one NOR gate will be taken as an example. FIG. 4 is a circuit diagram showing the structure of each of NOR gates 26 and 27.

Each of NOR gates 26 and 27 includes transistors 28 and 29 which are P channel MOS-FETs, and transistors 30 and 31 which are N channel MOS-FETs. An input terminal A receives the logic signal c or /c. An input terminal B receives the first logic signal Ia. An output terminal C is connected to first output node 51 or second output node 52 shown in FIG. 3. Transistor 28 has its source connected to a second power supply node 62 and its drain connected to the source of transistors 29. Transistor 29 has its drain connected to the output terminal C. Transistors 30 and 31 have their drains connected to the output terminal C and their sources connected to the first power supply node 61.

Input terminal A is connected to the gates of transistors 28 and 30. Input terminal B is connected to the gates of transistors 29 and 31.

The operation of NOR gate shown in FIG. 4 will be described. When the logic signal c or /c and the first logic signal Ia both attain the level of the first potential GND, transistors 28 and 29 are both turned on and transistors 30 and 31 are both turned off, whereby the potential of the output terminal C attains the second potential VEE. Otherwise, either or both of transistors 28 and 29 are turned off and either or both of transistors 30 and 31 are turned on, whereby the potential of the output terminal C attains the level of the first potential GND.

Thus, a signal representing the NOR result between the logic signal c and the first logic signal Ia, i.e. a signal representing the NOR result between the second logic signal Ib and the first logic signal Ia is provided as a first output signal Oa from the output terminal C of NOR gate 26 via first output node 51. A signal representing the NOR result between the logic signal /c and the first logic signal Ia, i.e. a signal representing the NOR result between the third logic signal /Ib and the first logic signal Ia is provided as a second output signal Ob from the output terminal C of NOR gate 27 via second output node 52.

FIG. 5 is a truth table of the composite logic circuit of FIG. 3. The relationship between the input signal and the output signal in the composite logic circuit of FIG. 3 will be described with reference to FIG. 5. First, the first output signal Oa will be described. When the first and second logic signals Ia and Ib both attain the level of the first potential GND, the first output signal Oa attains the level of the second potential VEE. Otherwise, the first output signal Oa attains the level of the first potential GND.

Next, the second output signal will be described. When first and third logic signals Ia and /Ib both attain the level of the first potential GND, the second output signal Ob attains the level of the second potential VEE. Otherwise, the second output signal Ob attains the level of the first potential GND.

Thus, a total of 12 transistors was required in the composite logic signal of FIG. 3.

Another example of a conventional composite logic circuit will be described with reference to FIG. 6. In FIG. 6, components corresponding to those of the composite logic circuit of FIG. 3 have the same reference numerals denoted, and their description will not be repeated.

The composite logic circuit of FIG. 6 is similar to that of FIG. 3 except for NAND gates 32 and 33 substituted for NOR gates 26 and 27 of the composite logic circuit of FIG. 3. In the composite logic circuit of FIG. 6, an NAND operation between the first and second logic signals Ia and Ib and an NAND operation between the first and third logic signals Ia and /Ib are carried out. The respective operation results are provided as first and second output signals Oa and Ob, respectively.

NAND gates 32 and 33 will be described in details. Because NAND gate 32 and NAND gate 33 have identical structures, one of NAND gates 32 and 33 will be taken as an example.

Each of NAND gates 32 and 33 includes transistors 34 and 35 which are P channel MOS-FETs, and transistors 36 and 37 which are N channel MOS-FETs. Transistors 34 and 35 respectively have their sources connected to a second power supply node 62 and their drains connected to the output terminal C. Transistor 36 has its drain connected to the output terminal C and its source connected to the drain of transistor 37. Transistor 37 has its source connected to the first power supply node 61. Transistors 34 and 36 have their gates connected to input terminal A. Transistors 35 and 37 have their gates connected to the input terminal B.

The operation of the NAND gate of FIG. 7 will be described. When logic signal c or /c and the first logic signal Ia both attain the level of the second potential VEE, transistors 36 and 37 are both turned on and transistors 34 and 35 are both turned off. This brings the potential of the output terminal C to the level of the first potential GND. Otherwise, either or both of transistors 36 and 37 are turned on and either or both of transistors 34 and 35 are turned off, whereby the potential of the output terminal C attains the level of the second potential VEE.

Thus, a signal representing the NAND result between the logic signal c and the first logic signal Ia, i.e. a signal representing the NAND result between second and first logic signals Ib and Ia is provided as the first output signal Oa from the output terminal C of NAND gate 32 via the first output node 51. A signal representing the NAND result between the logic signal /c and the first logic signal Ia, i.e. a signal representing the NAND result between third and first logic signals /Ib and Ia is provided from the output terminal C of NAND gate 33 as the second output signal Ob via the second output node 52.

FIG. 8 shows the truth table of the composite logic circuit of FIG. 6. The relationship between the input signal and the output signal of the composite logic circuit of FIG. 6 will be described with reference to FIG. 8. The first output signal Oa will be described first. When the first logic signal Ia attains the level of second potential VEE and the second logic signal Ib attains the level of the third potential VDD, the first output signal Oa is brought to the level of the first potential GND. Otherwise, the first output signal Oa is brought to the level of the second potential VEE.

The second output signal Ob will be described. When the first logic signal Ia attains the level of the second potential VEE, and the third logic signal /Ib attains the level of the third potential VDD, the second output signal Ob is brought to the level of the first potential GND. Otherwise, the second output signal Ob is brought to the level of the second potential VEE.

Thus, a total of 12 transistors is required in the composite logic circuit of FIG. 6.

As mentioned above, a conventional composite logic circuit such as those shown in FIGS. 3 and 6 require the great amount of 12 transistors. This requirement of many transistors in a conventional composite logic circuit resulted in a disadvantage of increasing the chip size when the circuit is implemented in an LSI.

SUMMARY OF THE INVENTION

An object of the present invention is to reduce the chip size of a composite logic circuit formed on a semiconductor chip in comparison with a conventional one.

Another object of the present invention is to reduce the number of transistors forming a composite logic circuit in comparison with a conventional one without degrading the circuit function.

A composite logic circuit according to the present invention includes a first input node, a second input node, a third input node, a first output node, a second output node, a first power supply node, a second power supply node, a first switching element, a second switching element, a third switching element, a fourth switching element, a fifth switching element, a sixth switching element, and a seventh switching element.

A first logic signal having the logic level changing between a first potential and a second potential is supplied to the first input node. A second logic signal having the logic level changing between the first potential and a third potential is supplied to the second input node. A third logic signal which is an inverted signal of the second logic signal is supplied to the third input node.

The first output node provides a first output signal representing the NOR of the first and second logic signals. The second output node provides a second output node representing the NOR of the first and third logic signals. The first power supply node receives a potential equal to the first potential. The second power supply node receives a potential equal to the second potential.

The first switching element has one end connected to the second power supply node, and is opened/closed in response to the first logic signal. The second switching element is connected between the other end of the first switching element and the first output node, and is opened/closed in response to the second output signal. The third switching element is connected between the other end of the first switching element and the second output node, and is opened/closed in response to the first output signal.

The fourth switching element is connected between the first power supply node and the first output node, and is opened/closed in response to the second logic signal. The fifth switching element is connected between the first power supply node and the first output node, and is opened/closed in response to the first logic signal. The sixth switching element is connected between the first power supply node and the second output node, and is opened/closed in response to the third logic signal. The seventh switching element is connected between the first power supply node and the second output node, and is opened/closed in response to the first logic signal.

When the first switching element is opened and the fifth and seventh switching elements are closed, the first and second output signals attain the first potential regardless of the logic level of the second and third logic signals. When the first switching element is closed, and the fifth and seventh switching elements are opened, the fourth and sixth switching elements are closed and opened, respectively, whereby second and third switching elements are closed and opened, respectively. This causes the first output signal to attain the second potential and the second output signal to attain the first potential. When the first switching element is closed, and the fifth and seventh switching elements are opened, the fourth and sixth switching elements are closed and opened, respectively, whereby the third and second switching elements are closed and opened, respectively. As a result, the first output signal attains the first potential, and the second output signal attains the second potential.

Thus, an NOR operation for logic signals having the logic level changing in different potential ranges can be carried out by a smaller number of switching elements than a conventional one. Because the number of switching elements forming a composite logic circuit can be reduced, the chip size of a semiconductor chip in which that circuit is formed can be reduced in comparison with a conventional one.

A composite logic circuit according to another aspect of the present invention includes a first input node, a second input node, a third input node, a first output node, a second output node, a first power supply node, a second power supply node, a first switching element, a second switching element, a third switching element, a fourth switching element, a fifth switching, element, a sixth switching element, and a seventh switching element.

A first logic signal having the logic level changing between a first potential and a second potential is supplied to the first input node, a second logic signal having the logic level changing between the first potential and a third potential is supplied to the second input node. A third logic signal which is an inverted signal of the second logic signal is supplied to the third input node.

The first output node provides a first output signal representing an NAND between first and second logic signals. The second output node provides a second output signal representing an NAND between first and third logic signals. The first power supply node receives a potential equal to the first potential. The second power supply node receives a potential equal to the second potential.

The first switching element has one end connected to the first power supply node, and is opened/closed in response to the first logic signal. The second logic signal is connected between the other end of the first switching element and the first output node, and is opened/closed in response to the second logic signal. The third switching element is connected between the other end of the first switching element and the second output node, and is opened/closed in response to the third logic signal.

The fourth switching element is connected between the second power supply node and the first output node, and is opened/closed in response to the second output signal. The fifth switching element is connected between the second power supply node and the second output node, and is opened/closed in response to the first output signal. The sixth switching element is connected between the second power supply node and the first output node, and is opened/closed in response to the first logic signal. The seventh switching element is connected between the second power supply node and the second output node, and is opened/closed in response to the first logic signal.

When the first switching element is opened, and the sixth and seventh switching elements are closed, the first and second output signals attain the second potential regardless of the second and third logic signals. When the first switching element is closed, and the sixth and seventh switching elements are opened, the second and third switching elements are closed and opened, respectively, whereby the fifth and fourth switching elements are closed and opened, respectively. As a result, the first output signal attains the first potential, and the second output signal attains the second potential. When the first switching element is closed, and the sixth and seventh switching elements are opened, the second and third switching elements are opened and closed, respectively, whereby the fourth and fifth switching elements are closed and opened, respectively. As a result, the first output signal attains the second potential, and the second output signal attains the first potential.

Thus, an NAND operation for logic signals having their logic levels changing in different potential ranges can be carried out by a smaller number of switching elements in comparison with a conventional one. Because the number of switching elements forming a composite logic circuit can be reduced, the chip size of a semiconductor chip in which that circuit is formed can also be reduced in comparison with a conventional one.

A composite logic circuit according to a further object of the present invention includes a first input node, a second input node, a third input node, a first output node, a second output node, a first logic circuit, a second logic circuit, and a third logic circuit.

A first logic signal having the logic level changing between a first potential and a second potential is supplied to the first input node. A second logic signal having the logic level changing between the first potential and a third potential is supplied to the second input node. A third logic signal which is an inverted signal of the second logic signal is supplied to the third input node. The first output node provides a first output signal representing the NOR between first and second logic signals. The second output signal provides a second output signal representing an NOR between first and third logic signals.

The first logic circuit brings the levels of the first and second output signals to the first potential when the potential of the first logic signal is the second potential.

The second logic circuit brings the levels of the first and second output signals to the second and first potentials, respectively, when the potential of the first logic signal is the first potential, the potential of the second logic signal is the first potential, and the potential of the third logic signal is the third potential.

The third logic circuit brings the levels of the first and second output signals to the first and second potentials, respectively, when the potential of the first logic signal is the first potential, the potential of the second logic signal is the third potential, and the potential of the third logic signal is the first potential.

Thus, an NOR operation can be carried out for logic signals having their logic levels changing in different potential ranges. Because the entire circuit can be divided into a plurality of circuits for each operation function of an NOR operation, the number of switching elements forming the entire circuit can be reduced in comparison with a conventional one. Because the number of switching elements can be reduced, the chip size of a composite logic circuit formed in a semiconductor chip can be reduced in comparison with a conventional one.

A composite logic circuit according to still another aspect of the present invention includes a first input node, a second input node, a third input node, a first output node, second output node, a first logic circuit, a second logic circuit, and a third logic circuit.

A first logic signal having the logic level changing between a first potential and a second potential is supplied to the first input node. A second logic signal having the logic level changing between the first potential and a third potential is supplied to the second input node. A third logic signal which is an inverted signal of the second logic signal is supplied to the third input node. The first output node provides a first output signal representing an NAND between the first and second logic signals. The second output node provides a second output signal representing an NAND between the first and third logic signals.

The first logic signal brings the level of the first and second output signals to the second potential when the potential of the first logic signal is the first potential.

The second logic signal brings the level of the first and second output signals to the second and first potentials, respectively, when the potential of the first logic signal is the second potential, the potential of the second logic signal is the first potential, and the potential of the third logic signal is the third potential.

The third logic circuit brings the levels of the first and second output signals to the first and second potentials, respectively, when the potential of the first logic signal is the second potential, the potential of the second logic signal is the third potential, and the potential of the third logic signal is the first potential.

Thus, an NAND operation can be carried out for logic signals having logic levels changing in different potential ranges. Because the entire circuit is divided into a plurality of circuits for each operation function of an NAND operation, the number of switching elements forming the entire circuit can be reduced in comparison with the conventional one. Because the number of the switching elements can be reduced, the chip size of a composite logic circuit formed in a semiconductor chip can be reduced in comparison with the conventional one.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter with reference to the drawings.

Figure 1:
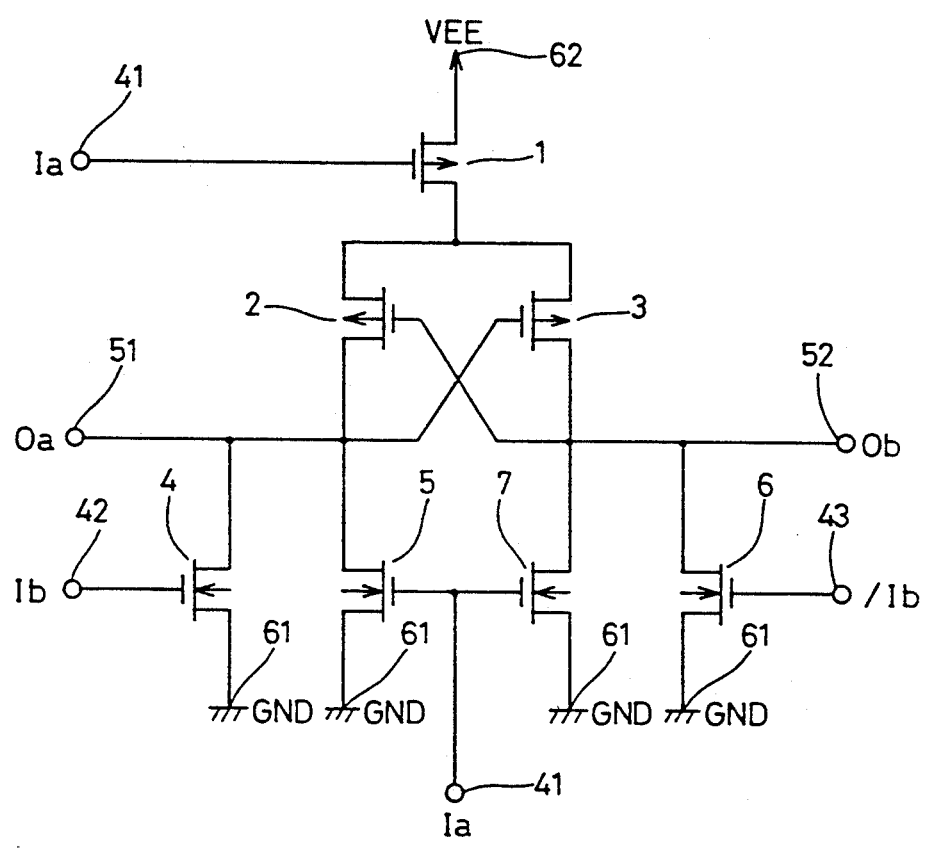
FIG. 1 is a circuit diagram of a composite logic circuit according to an embodiment of the present invention.
Figure 3:
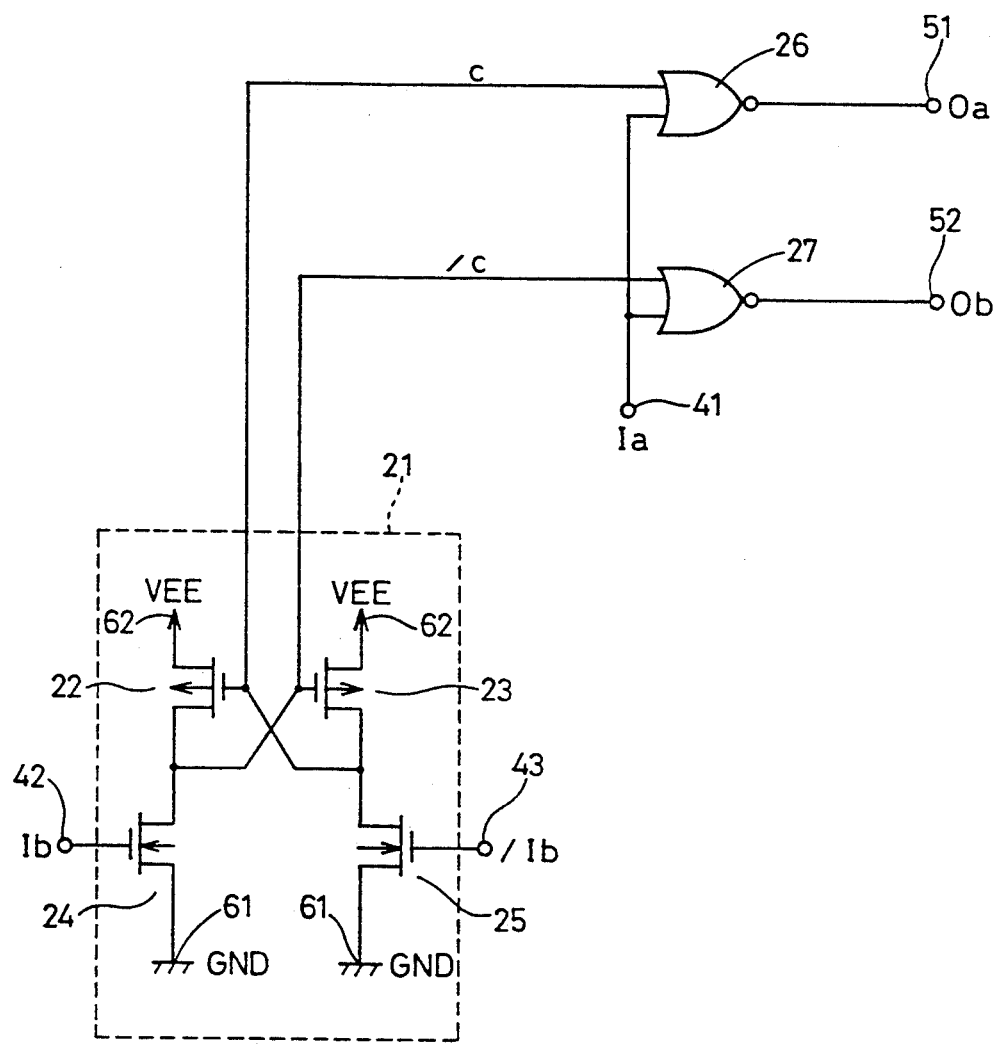
FIG. 3 is a circuit diagram of a conventional composite logic circuit.

FIG. 1 is a circuit diagram of a composite logic circuit according to an embodiment of the present invention, which carries out a logic operation similar to that of the logic circuit of FIG. 3. Referring to FIG. 1, a composite logic circuit includes transistors 1, 2 and 3 which are P channel MOS-FETs, and transistors 4, 5, 6 and 7 which are N channel MOS-FETs.

A first logic signal Ia having the logic level changed between a first potential GND and a second potential VEE under the relationship of VEE>GND is supplied to a first input node 41. A second logic signal Ib having its logic level changing between the first potential GND and a third potential VDD under the relationship of VDD>GND is supplied to a second input node 42. A third logic signal /Ib which is an inverted signal of the second logic signal Ib is supplied to a third input node 43. A first output node 51 provides a first output signal Oa representing an NOR between a first and second logic signals Ia and Ib. A second output node 52 provides a second output signal Ob representing an NOR between first and third logic signals Ia and /Ib. A first power supply node 61 receives the first potential GND, and a second power supply node 62 receives the second potential VEE.

Transistor 1 has its source connected to a second power supply node 62, and its drain connected to the respective sources of transistors 2 and 3. Transistor 2 has its drain connected to the first output node 51. Transistor 3 has its drain connected to the second output node 52. Transistors 4-7 have their respective sources connected to the first power supply node 61. Transistors 4 and 5 have their respective drains connected to the first output node 51. Transistors 6 and 7 have their respective drains connected to the second output node 52.

Transistors 1, 5 and 7 have their gates connected to the first input node 41. Transistor 2 has its gate connected to the second output node 52. Transistor 3 has its gate connected to the first output node 51. Transistor 4 has its gate connected to the second input node 42. Transistor 6 has its gate connected to the third input node 43.

The operation of the composite logic circuit of FIG. 1 will be described hereinafter. When the first logic signal Ia attains the level of the second potential, transistor 1 is turned off, and transistors 5 and 7 are both turned on. Therefore, the first and second output nodes 51 and 52 both attain the first potential GND, whereby the first and second output signals Oa and Ob both attain the level of the first potential GND, regardless of the logic level of the second and third logic signals Ib and /Ib, i.e. regardless of the ON/OFF state of transistors 4 and 6.

When the first logic signal Ia is at the level of the first potential GND, transistor 1 is turned on, and transistors 5 and 7 are both turned off.

When the second logic signal Ib is at the level of the third potential VDD and the third logic signal /Ib is at the level of the first potential GND under this state, transistor 4 is turned on and transistor 6 is turned off. This brings the potential of the first output node 51 to the first potential GND, whereby the first output signal Oa attains the level of the first potential GND. Here, transistor 3 having the first output signal Oa supplied to its gate is turned on. Because transistors 1 and 3 are both turned on, the second output node 52 attains the second potential VEE, whereby the second output signal Ob attains the level of the second potential VEE.

When the second and third logic signals Ib and /Ib attain the levels of the first potential GND and the third potential VDD, respectively, under the state where the first logic signal Ia is at the level of the first potential GND and transistors 1, 5 and 7 are ON, OFF and OFF, respectively, transistor 4 is turned off and transistor 6 is turned on. This causes the potential of the second output node 52 to attain the first potential GND, whereby the second output signal Ob attains the first potential GND. In this case, transistor 2 having the second output signal Ob supplied to its gate is turned on. Because transistors 1 and 2 are both turned on, the first output node 51 attains the second potential VEE, whereby the first output signal Oa attains the level of the second potential VEE.

Figures 4, 5:
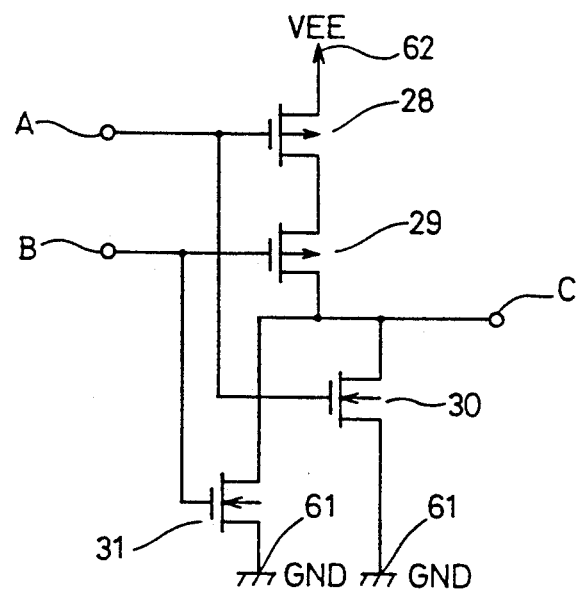
FIG. 4 is a circuit diagram of an NOR gate included in the composite logic circuit of FIG. 3.
FIG. 5 is a truth table of the composite logic circuit of FIG. 3.

A truth table of the above-described operation is shown in FIG. 5. The first output signal Oa will be described. When the first and second logic signals Ia and Ib both attain the level of the first potential GND, the first output signal Oa attains the level of the second potential VEE, otherwise the level of the first potential GND. Regarding the second output signal Ob, when the first and third logic signal Ia and /Ib both attain the level of the first potential GND, the second output signal Ob attains the level of the second potential VEE, otherwise the level of the first potential GND.

Thus, the composite logic circuit of FIG. 1 can carry out logical operation with 7 transistors in comparison with the conventional case where 12 transistors are required. Because the number of transistors forming the composite logic circuit of FIG. 1 is reduced in comparison with the conventional one, the chip size of a composite logic circuit formed on a semiconductor chip can be reduced in comparison with the conventional one.

Figure 2:
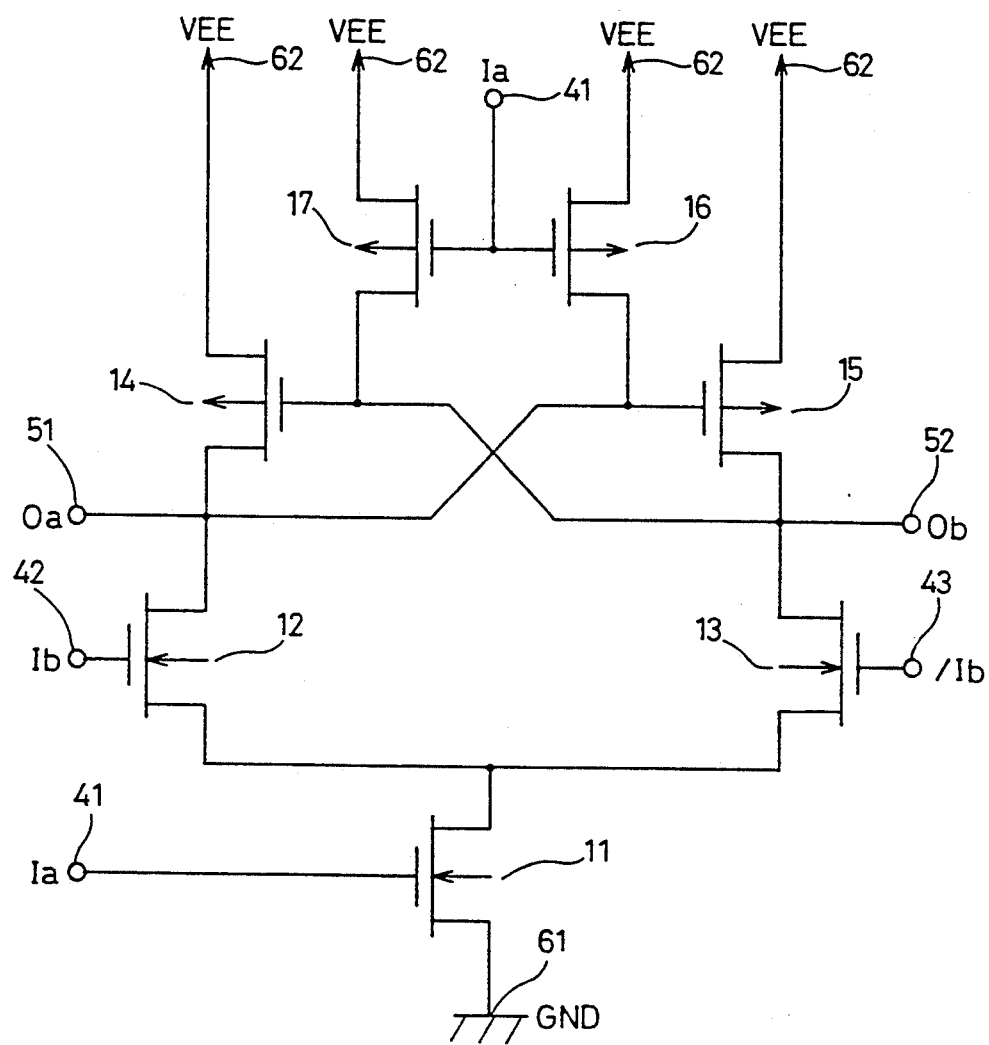
FIG. 2 is a circuit diagram of a composite logic circuit according to another embodiment of the present invention.
Figure 6:
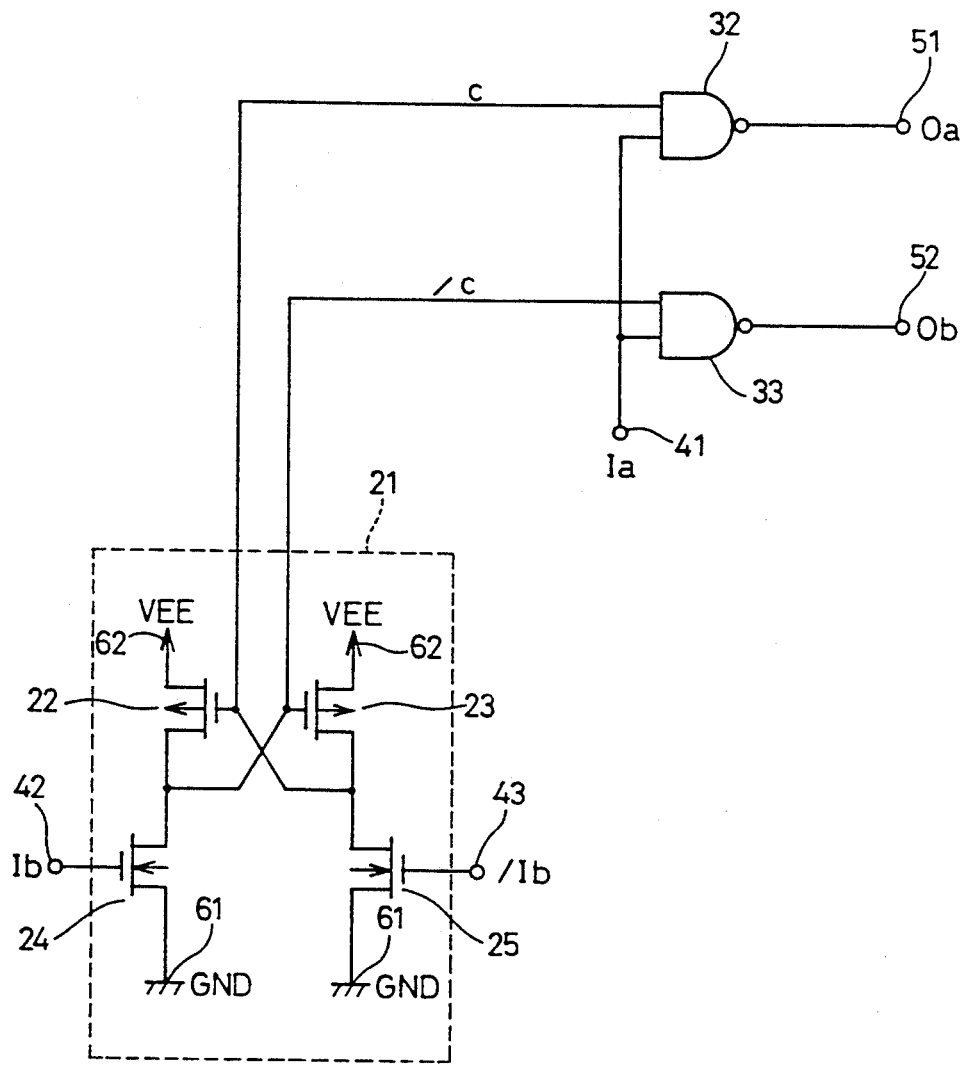
FIG. 6 is a circuit diagram of a conventional composite logic circuit.

FIG. 2 is a circuit diagram of a composite logic circuit according to another embodiment of the present invention. The composite logic circuit of FIG. 2 carries out logical operation similar to that of the composite logic circuit of FIG. 6. Referring to FIG. 2, the composite logic circuit includes transistors 11, 12 and 13 which are N channel MOS-FETs, and transistors 14, 15, 16 and 17 which are P channel MOS-FETs.

A first logic signal Ia having the logic level changing between a first potential GND and a second potential VEE under the relationship of VEE>GND is supplied to a first input node 41. A second logic signal Ib having its logic level changing between the first potential GND and a third potential VDD under the relationship of VDD>GND is supplied to a second input node 42. A third logic signal /Ib which is an inverted signal of the second logic signal Ib is supplied to a third input node 43.

A first output node 51 provides a first output signal Oa representing an NAND between the first and second logic signals Ia and Ib. A second output node 52 provides a second output signal Ob representing an NAND result between the first and third logic signals Ia and /Ib. A first power supply node 61 receives the first potential GND, and a second power supply node 62 receives the second potential VEE.

Transistors 14, 15, 16 and 17 respectively have their sources connected to the second power supply node 62. Transistor 14 has its drain connected to the first output node 51. Transistor 15 has its drain connected to the second output node 52. Transistor 16 has its drain connected to the first output node 51. Transistor 17 has its drain connected to the second output node 52. Transistors 12 and 13 have their sources connected to the drain of transistor 11. Transistor 12 has its drain connected to the first output node 51, and transistor 13 has its drain connected to the second output node 52. Transistor 11 has its source connected to the first power supply node 61.

Transistors 11, 16 and 17 have their gates connected to the first input node 41. Transistor 12 has its gate connected to the second input node 42. Transistor 13 has its gate connected to the third input node 43. Transistor 14 has its gate connected to the second output node 52. Transistor 15 has its gate connected to the first output node 51.

The operation of the composite logic signal of FIG. 2 will be described hereinafter. When the first logic signal Ia is at the level of the first potential GND, transistors 16 and 17 are both turned on and transistor 11 is turned off. Therefore, the first and second output signals Oa and Ob both attain the level of the second potential VEE caused by the first and second output nodes both attaining the second potential VEE, regardless of the logic level of the second and third logic signals Ib and /Ib, i.e. regardless of the ON/OFF states of transistors 12 and 13.

When the first logic signal Ia is at the level of the second potential VEE, transistors 16 and 17 are both turned off and transistor 11 is turned on.

When the second logic signal Ib attains the level of the third potential VDD and the third logic signal /Ib attains the level of the first potential GND under this state, transistor 12 is turned on and transistor 13 is turned off. This brings the potential of the first output node 51 to the first potential GND, whereby the first output signal Oa attains the level of the first potential GND. In this case, transistor 15 having the first output signal Oa supplied to its gate is turned on. As a result, the second output node 52 attains the second potential VEE, and the second output signal Ob attains the level of the second potential VEE.

When the second logic signal Ib attains the first potential GND and the third logic signal /Ib attains the third potential VDD under the state where the first logic signal Ia is at the level of the second potential VEE and transistors 16, 17, and 11 are OFF, OFF, and ON, respectively, as described above, transistor 12 is turned off and transistor 13 is turned on. This brings the second output node 52 to the first potential GND, whereby the second output signal Ob attains the level of the first potential GND. In this case, transistor 14 having the second output signal Ob supplied to its gate is turned on. Thus, the first output node 51 attains the second potential VEE, whereby the first output signal Oa is brought to the level of the second potential VEE.

Figures 7, 8:
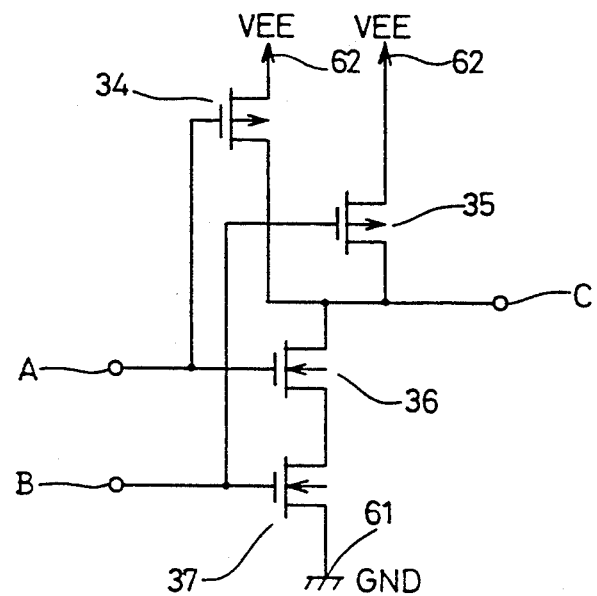
FIG. 7 is a circuit diagram of an NAND gate included in the composite logic circuit of FIG. 6.
FIG. 8 is a truth table of the composite logic circuit of FIG. 6.

The above-described operation is shown in the truth table of FIG. 8. Referring to FIG. 8, the first output signal Oa will be described first. When the first logic signal Ia is at the level of the second potential VEE, and the second logic signal Ib attains the level of the third potential VDD, the first output signal Oa attains the level of the first potential GND, otherwise the level of the second potential VEE.

The second output signal Ob will be described. When the first logic signal Ia attains the level of the second potential VEE, and the third logic signal /Ib attains the level of the third potential VDD, the second output signal Ob attains the level of the first potential GND, otherwise the level of the second potential VEE.

Thus, as described above, the composite logic circuit of FIG. 2 can execute logical operation with 7 transistors in comparison with the conventional case where 12 transistors are required. Because the composite logic circuit of FIG. 2 can have the number of transistors forming that circuit reduced in comparison with a conventional one, the chip size of a composite logic circuit formed in a semiconductor chip can be reduced in comparison with a conventional one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite logic circuit comprising:
   a first input node to which a first logic signal having a logic level changing between a first potential and a second potential is supplied,
   a second input node to which a second logic signal having a logic level changing between said first potential and a third potential is supplied,
   a third input node to which a third logic signal which is an inverted signal of said second logic signal is supplied,
   a first output node for providing a first output signal representing an NOR of said first and second logic signals,
   a second output node for providing a second output signal representing an NOR of said first and third logic signals,
   a first power supply node for receiving a potential equal to said first potential,
   a second power supply node for receiving a potential equal to said second potential,
   first switching means having one end connected to said second power supply node, and opened and closed in response to said first logic signal,
   second switching means connected between the other end of said first switching means and said first output node, and opened and closed in response to said second output signal,
   third switching means connected between the other end of said first switching means and said second output node, and opened and closed in response to said first output signal,
   fourth switching means connected between said first power supply node and said first output node, and opened and closed in response to said second logic signal,
   fifth switching means connected between said first power supply node and said first output node, and opened and closed in response to said first logic signal,
   sixth switching means connected between said first power supply node and said second output node, and opened and closed in response to said third logic signal, and seventh switching means connected between said first power supply node and said second output node, and opened and closed in response to said first logic signal.

2. A composite logic circuit comprising:
   a first input node to which a first logic signal having a logic level changing between a first potential and a second potential is supplied,
   a second input node to which a second logic signal having a logic level changing between said first potential and a third potentials, is supplied, a third input node to which a third logic signal which is an inverted signal of said second logic signal is supplied, a first output node for providing a first output signal representing an NAND of said first and second logic signals, a second output node for providing a second output signal representing an NAND of said first and third logic signals, a first power supply node for receiving a potential equal to said first potential, a second power supply potential for receiving a potential equal to said second potential, first switching means having one end connected to said first power supply node, and opened and closed in response to said first logic signal, second switching means connected between the other end of said first switching means and said first output node, and opened and closed in response to said second logic signal, third switching means connected between the other end of said first switching means and said second output node, and opened and closed in response to said third logic signal, fourth switching means connected between said second power supply node and said first output node, and opened and closed in response to said second output signal, fifth switching means connected between said second power supply node and said second output node, and opened and closed in response to said first output signal, sixth switching means connected between said second power supply node and said first output node, and opened and closed in response to said first logic signal, and seventh switching means connected between said second power supply node and said second output node, and opened and closed in response to said first logic signal.

3. A composite logic circuit comprising:

a first input node to which a first logic signal having a logic level changing between a first potential and a second potential is supplied, a second input node to which a second logic signal having a logic level changing between said first potential and a third potential is supplied, a third input node to which a third logic signal which is an inverted signal of said second logic signal is supplied, a first output node for providing a first output signal representing an NOR of said first and second logic signals, a second output node for providing a second output signal representing an NOR of said first and third logic signals, first logic means for bringing the respective signal levels of said first and second output signals to said first potential when the potential of said first logic signal is said second potential, second logic means for bringing the signal level of said first output signal to said second potential and the signal level of said second output signal to said first potential, when the potential of said first logic signal is said first potential, the potential of said second logic signal is said first potential, and the potential of said third logic signal is said third potential, and third logic means for bringing the signal level of said first output signal to said first potential and the signal level of said second output signal to said second potential, when the potential of said first logic signal is said first potential, the potential of said second logic signal is said third potential, and the potential of said third logic signal is said first potential.

4. A composite logic circuit comprising:

a first input node to which a first logic signal having a logic level changing between a first potential and a second potential is supplied, a second input node to which a second logic signal having a logic level changing between said first potential and a third potential is supplied, a third input node to which a third logic signal which is an inverted signal of said second logic signal is supplied, a first output node for providing a first output signal representing an NAND of said first and second logic signals, a second output node for providing a second output signal representing an NAND of said first and third logic signals, first logic means for bringing the respective signal levels of said first and second output signals to said second potential when the potential of said first logic signal is said first potential, second logic means for bringing the signal level of said first output signal to said second potential and the signal level of said second output signal to said first potential, when the potential of said first logic signal is said second potential, the potential of said second logic signal is said first potential, and the potential of said third logic signal is said third potential, and third logic means for bridging the signal level of said first output signal to said first potential, and the signal level of said second output signal to said second potential, when the potential of said first logic signal is said second potential, the potential of said second logic signal is said third potential, and the potential of said third logic signal is said first potential.

* * * * *